United States Patent [19]

Kohyama et al.

[11] Patent Number: 4,664,679

[45] Date of Patent: May 12, 1987

[54] AQUEOUS DISPERSION OF SILICIC ANHYDRIDE AND ABRASIVE COMPOSITION COMPRISING THE DISPERSION

[75] Inventors: Katsuhisa Kohyama; Tsuneo Kimura, both of Kita-Kyushu; Teruo Kidera, Fukumamachi; Yukio Kajiwara, Kita-Kyushu, all of Japan

[73] Assignee: Mitsubishi Chemical Industries Ltd., Tokyo, Japan

[21] Appl. No.: 802,013

[22] Filed: Nov. 25, 1985

[30] Foreign Application Priority Data

Dec. 4, 1984 [JP] Japan .................................. 59-256363

[51] Int. Cl.$^4$ ............................................ B24D 3/02
[52] U.S. Cl. ...................................... 51/308; 51/307; 106/287.34
[58] Field of Search ................................. 51/308, 309; 106/287.34

[56] References Cited

U.S. PATENT DOCUMENTS

| | | | |
|---|---|---|---|
| 3,922,393 | 11/1975 | Sears, Jr. | 51/308 |
| 4,260,396 | 4/1981 | Glemza | 106/3 |
| 4,397,906 | 8/1983 | Nakagawa et al. | 428/206 |
| 4,588,421 | 5/1986 | Payne | 51/308 |

FOREIGN PATENT DOCUMENTS

| | | |
|---|---|---|
| 0017028 | 10/1980 | Fed. Rep. of Germany . |
| 006756 | 4/1978 | Japan . |
| 20350 | 1/1982 | Japan . |

*Primary Examiner*—Paul Lieberman
*Assistant Examiner*—Willie J. Thompson
*Attorney, Agent, or Firm*—Oblon, Fisher, Spivak, McClelland, & Maier

[57] ABSTRACT

An aqueous dispersion of silicic anhydride, comprising an aqueous solvent and silicic anhydride dispersed therein, wherein the silicic anhydride has a surfacial silanol group density of from 0.3 to 3 per 100 $Å^2$ and is obtained by the surface treatment of silicic anhydride produced by a dry method.

18 Claims, No Drawings

AQUEOUS DISPERSION OF SILICIC ANHYDRIDE AND ABRASIVE COMPOSITION COMPRISING THE DISPERSION

The present invention relates to an aqueous dispersion of silicic anhydride and an abrasive composition comprising the dispersion.

Aqueous dispersions of silicic anhydride are widely used as abrasives for various materials, as blocking preventive agents for various films, as surface treating agents for photosensitive papers, as adhesive adjuvants for glass fibers, as finishing agents for fabrics or stabilizers for emulsions or wax. For instance, Japanese Examined Patent Publication No. 6756/1978 discloses an abrasive composition composed of a dispersion comprising silica sol and abrasive powder such as alumina contained in water and/or a water-soluble organic solvent, and its use for polishing e.g. a flint glass plate.

In recent years, the demand for colloidal dispersions of silicic anhydride has increased as abrasives for semiconductor materials such as silicon wafers. As an abrasive for semiconductor materials in which even a slight degree of surface roughness is critical to the performance of the semiconductor, superior abrasive properties and convenience for handling are required. This requirement tends to be increasingly severe.

Processes for the production of silica particles are generally classified into a wet method and a dry method. The shape of particles obtained by a wet method is usually irregular and angular, whereas the particles obtained by a dry method are usually round and generally spherical particles. Both types of particles are used as abrasive grains for abrasives for semiconductor materials. However, it is known that in the case of an abrasion operation utilizing a mechanochemical reaction, it is preferred to use round generally spherical particles of silicic anhydride obtained by a dry method as the quality of the polished surface is superior (see e.g. Japanese Examined Patent Publication No. 20350/1982). Silicic anhydride produced by a dry method is highly pure without containing an alkali metal such as sodium, and thus is particularly suitable as abrasive grains for abrasives. However, silicic anhydride produced by a dry method tends to condense and thicken, and at a silicic anhydride concentration of 10% by weight or higher, gelation takes place, whereby silicic anhydride can not be used as an abrasive. On the other hand, at a low concentration of less than 10% by weight, precipitation of silica takes place. In order to avoid such precipitation, it is known to incorporate a water soluble carboxy polymethylene rubber or xanthane rubber, for instance, in U.S. Pat. No. 4,260,396. Further, this U.S. patent discloses that it has been common to incorporate a water soluble cellulose derivative for this purpose. However, in a method of preventing the precipitation of silica by incorporating a precipitation preventive agent such as the disclosed water soluble organic polymer, a substantial amount of the precipitation preventive agent must be used to obtain the effectiveness, or even if such effectiveness is obtained, the slurry becomes viscous and the organic substance which is undesirable for the abrasive will be contained in a substantial amount.

It is an object of the present invention to solve such problems and to provide an aqueous dispersion of silicic anhydride, which has a low viscosity even at a high concentration, and which is free from the precipitation of particles even without the addition of a precipitation preventive agent such as a water soluble organic polymer.

Another object of the present invention is to provide an abrasive composition comprising an aqueous dispersion of silicic anhydride.

The present invention provides an aqueous dispersion of silicic anhydride, comprising an aqueous solvent and silicic anhydride dispersed therein, wherein the silicic anhydride has a surfacial silanol group density of from 0.3 to 3 per 100 $Å^2$ and is obtained by the surface treatment of silicic anhydride produced by a dry method.

The present invention also provides an abrasive composition comprising such an aqueous dispersion of silicic anhydride.

Now, the present invention will be described in detail with reference to the preferred embodiments.

Silica used in the present invention is limited to silicic anhydride produced by a dry method. As mentioned above, processes for the production of silica particles are generally classified into a wet method and a dry method. Silica particles produced by the wet method are water-containing silicic acid and their surface area is greater than that of silicic anhydride of the same particle size produced by the dry method, and their hygroscopicity is higher. For these reasons, they are not suitable for the present invention.

For the production of silicic anhydride by a dry method, various methods may be mentioned including a method wherein a silicon halide such as silicon tetrachloride is hydrolyzed in a high temperature burner flame, a method wherein silicon tetrachloride, ammonia and steam are reacted in a gas phase, a method wherein an organic silicon compound such as tetramethoxysilane is pyrolized, a method wherein a fine silicon powder is subjected to combustion, a method wherein a silicon sulfide is subjected to combustion, and a method wherein a mixture of coke and a natural silicic anhydride-containing material is subjected to arc heating and reoxidized. Silicic anhydride to be used in the present invention, is not restricted by the method for its preparation. However, silicic anhydride obtained by the high temperature hydrolysis of a silicon halide and so-called fumed silica is particularly preferred.

Silicic anhydride to be used in the present invention usually has a specific surface area of from 60 to 600 $m^2/g$, preferably from 100 to 500 $m^2/g$, and a particle size of from 0.01 to 1 $\mu m$, preferably from 0.01 to 0.1 $\mu m$.

Silicic anhydride obtained by a dry method usually has a surfacial silanol group density of greater than 3 per 100 $Å^2$. In the present invention, however, it is necessary to bring the surfacial silanol group density to a level of from 0.3 to 3 per 100 $Å^2$ by subjecting silicic anhydride obtained by the dry method to surface treatment. The surfacial silanol group density is preferably from 0.5 to 2.5 per 100 $Å^2$, more preferably from 0.5 to under 2 per 100 $Å^2$.

As a method for reducing the surfacial silanol group density by the surface treatment of silicic anhydride, there may be employed various methods including a method wherein silanol groups are reacted with various coupling agents, a method wherein silanol groups are esterified with an alcohol, and a method wherein silanol groups are subjected to dehydration condensation under heating and so on. When a method of reducing silanol groups by the introduction of organic groups by reacting the silanol groups with e.g. a coupling agent or an alcohol, is employed, it is likely that the hydrophobic nature becomes so strong that the wettability to the aqueous solvent of the present invention tends to be poor and a uniform dispersion tends to be difficult, and in order to avoid such difficulties, a care is necessary so that the amount of the coupling agent or the alcohol is controlled within the range where the surfacial silanol group density can be brought in the range of the present invention. The degree of such treatment can be evaluated by the organic carbon content introduced into silicic anhydride, which is measured by an apparatus for organic elemental analysis.

As the coupling agent used for the reduction of the surfacial silanol group density of silicic anhydride, there may be mentioned a silane coupling agent such as methyl- trimethoxysilane or hexamethyldisilazane, an aluminum coupling agent such as an acetoalkoxy aluminum diisopropylate, an organotitanium coupling agent such as isopropyltriisostearoyl titanate, and an organophosphorus coupling agent such as dibutyl 2-methallyloxyethyl phosphate. When the surfacial silanol group density is to be brought within the range of the present invention by the introduction of organic groups into silicic anhydride by reacting the silanol groups with a coupling agent, the content of the total organic carbon in silicic anhydride after the treatment is preferably within the range of from 0.1 to 3.0% by weight, since if the content of the total organic carbon exceeds 3% by weight, the hydrophobic nature tends to be too strong, whereby it becomes difficult to obtain a uniform dispersion. The method for treating with the coupling agent is not particularly restricted, and usual liquid phase treatment or gas phase treatment may be employed.

As the alcohol used for the reduction of the surfacial silanol group density of silicic anhydride, there may be mentioned a straight chain or branched chain saturated monohydric alcohol having from 1 to 18 carbon atoms such as methanol, ethanol, n-propanol, iso-propanol, n-butanol or t-butanol. In the case where the surfacial silanol group density is brought into the range of the present invention by the introduction of organic groups into silicic anhydride by the esterification reaction of silanol groups with an alcohol, the content of the total organic carbon in the above-mentioned silica is preferably from 0.1 to 6.0% by weight. If the total organic carbon content exceeds 6.0% by weight, the hydrophobic nature is too strong to obtain a uniform dispersion in the aqueous solvent. The treatment is conducted preferably in a gas phase, and a preferred temperature is at least the boiling point of the alcohol used and not higher than 350° C.

When the surfacial silanol group density of the silicic anhydride is to be reduced by the dehydration condensation of silanol groups under heating, the material is simply heated at a temperature of at least 300° C., preferably at least 500° C.

In short, any treating method may be employed so long as the surfacial silanol group density of silicic anhydride is brought within the range of the present invention.

However, when the surfacial silanol group density exceeds 0.3 per 100 Å$^2$, there is a general tendency that as the total organic carbon content in the silicic anhydride increases, the hydrophilic nature decreases, and when dispersed the silicic anhydride in an aqueous solvent, the viscosity decreases. Therefore, the total organic carbon content is preferably as large as possible within the above-mentioned range so that the viscosity can be kept low. When silicic anhydride with the surfacial silanol group density being outside the range of the present invention, is dispersed in an aqueous solvent, the dispersion will have a high viscosity, or precipitation of silicic anhydride will be observed, such being undesirable. Particularly when the surfacial silanol group density is to be reduced by using a coupling agent, if the density is less than 0.3 per 100 Å$^2$, the viscosity of the dispersion becomes higher and thixotropy appears, such being undesirable. The reason for this is not clearly understood. However, it is conceivable that because of the highly hydrophobic nature, some force of the hydrophobic bond different from the function of the hydrogen bond is in action.

The surfacial silanol groups in silicic anhydride thus obtained can be quantitatively analyzed by various methods by using their reactivity. In the present invention, the surfacial silanol group density is determined by calculation based on the following equation from the specific surface area of silicic anhydride obtained by BET method based on the N$_2$ absorption and the amount of hydrogen which is produced by the reaction of silicic anhydride with LiAlH$_4$ in accordance with the following reaction formula (1), and is quantitatively analyzed by gas chromatography.

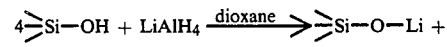

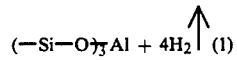

$$\text{Surfacial silanol group density (number of silanol groups/100 Å}^2\text{)} = \frac{X \times N}{A \times 10^{20}} \times 100$$

where
N: Avogadro's constant $6.023 \times 10^{23}$
A: Specific surface area of silicic anhydride (m$^2$/g)
X: Amount of hydrogen produced by the reaction of 1 g of silicic anhydride with LiAlH$_4$ (mol/g)

The aqueous solvent of the present invention in which the above silicic anhydride is dispersed, is meant for water or an aqueous solution containing a water soluble organic solvent. The water soluble organic solvent includes alcohols such as methanol, ethanol, isopropanol and glycerol, ketones such as acetone, esters such as methyl acetate, organic carboxylic acids such as formic acid and acetic acid, organic amines such as dimethylamine, aldehydes such as formaldehyde and acetaldehyde, dioxane and tetrahydrofuran. When the aqueous solvent is a mixture of water and an organic solvent, the ratio of the organic solvent to water may vary depending upon the type of the organic solvent, but is not particularly restricted so long as a uniform phase is formed with water. As the aqueous solvent, it is preferred to use water alone.

The aqueous dispersion of silicic anhydride of the present invention is obtained by dispersing the above-mentioned silicic anhydride in the above-mentioned aqueous solvent so that the dispersion contains from 5 to 50% by weight of silicic anhydride. The dispersion of the silicic anhydride in the aqueous solvent can be conducted by using a conventional stirrer, homo mixer, high-shearing blender or turbine mixer. If the dispersion of the silicic anhydride in the aqueous solvent is inferior, the precipitates are likely to appear, or the viscosity tends to be abnormally high. Accordingly, it is advisable to use a high-shearing type dispersing machine in order to obtain a uniform suspension.

The aqueous dispersion of silicic anhydride of the present invention thus obtained, has excellent storage stability. Even when stored for more than one month, no precipitation of silicic anhydride particles is observed, or if observed, the precipitates are readily be dispersed to form a uniform slurry by simple shaking. Adequate precipitation preventive effects are obtainable without an addition of a precipitation preventive agent such as a water soluble polymer which used to be added, and if required, organic amines, sodium hydroxide, ammonium hydroxide, etc. which are commonly used as a pH controlling agent, may be added.

The aqueous dispersion of silicic anhydride of the present invention is useful for a wide range of applications, for instance, as an abrasive for semiconductor substrates, rigid disc substrates, thin film magnetic head substrates, optical fibers, laser mirror, etc., as a blocking preventive agent for various films, as a surface treating agent for photosensitive papers, etc., as an adhesive adjuvant for glass fibers, etc., a finishing agent for fabrics, and as a stabilizer for emulsions or wax.

The aqueous dispersion of the present invention is particularly useful as an abrasive for metal such as semiconductors, since it has low viscosity and excellent dispersibility even when the silicic anhydride concentration is relatively high.

The aqueous dispersion of silicic anhydride of the present invention may be used alone as an abrasive for metals. However, when alumina is incorporated, even better abrasive effects are obtained. Irrespective of the crystal form such as $\alpha, \beta, \gamma$ etc., any alumina may be incorporated to the aqueous dispersion of silicic anhydride of the present invention. However, particularly preferred is $\alpha$-alumina. The average particle size of the alumina is usually from 0.01 to 0.3 $\mu$m, preferably 0.1$\pm$0.06 $\mu$m. With respect to the abrasive composition comprising an aqueous dispersion of silicic anhydride containing alumina, there is no particular restriction as to the manner for its preparation so long as the aqueous dispersion of silicic anhydride of the present invention further contains alumina. However, it is preferably prepared by mixing alumina sol into the aqueous dispersion of silicic anhydride of the present invention, or by dispersing and mixing alumina particles to the aqueous dispersion of silicic anhydride of the present invention. As the dispersing medium for alumina particles in the case where alumina sol is used, the same aqueous solvent as used for the aqueous dispersion of silicic anhydride of the present invention may be employed. However, water or an alcohol is preferred for the use as an abrasive. The proportion of alumina in the alumina sol is usually from 10 to 40% by weight. The aqueous dispersion of silicic anhydride containing alumina, thus obtained, may be used by diluting it with water, depending upon the conditions for abrasion treatment such as the material to be treated, the pressure for abrasion, the type of fixing plate or the rotational speed. The proportion of alumina in the abrasive comprising an aqueous dispersion of silicic anhydride containing alumina, is from 0.5 to 2 times by weight relative to the silicic anhydride. Further, the total amount of the silicic anhydride and alumina in the abrasive finally prepared is from 5 to 50% by weight, in the aqueous dispersion.

The abrasive of the present invention thus obtained is useful for the abrasion of metals such as silicon wafers.

As the method for abrasion, there may be employed a conventional method in which a commercially available polishing or rubbing machine is used. The amount of the abrasive, pressure, speed, time, etc. for abrasion are suitably selected depending upon the type of the material to be treated, and the required quality of the surface finishing.

The abrasive of the present invention comprises the dispersion of silicic anhydride obtained by the surface treatment of silicic anhydride produced by a dry method and having a specific range of a surfacial silanol group density, and preferably alumina as the other component, in an aqueous solvent, and it has advantageous properties for handling such as excellent dispersibility and stability for long period of time, and also has excellent effects as an abrasive for various metals including semiconductor substrate such as silicon wafers.

Now, the present invention will be described in further detail with reference to Examples. However, it should be understood that the present invention is by no means restricted to these specific Examples.

The surfacial silanol group density was measured in accordance with the following method.

Measurement of surfacial silanol group density

Silicic anhydride was dried at a temperature of 120° C., under a pressure of not higher than 15 mm Hg for 3 hours to remove the adsorbed water. Then, 1.0 g of the silicic anhydride was added to 30 ml of water-free dioxane, and adequately dispersed by e.g. supersonic wave, to obtain a slurry. 0.3 g of LiAlH$_4$ and 10 ml of water-free dioxane were charged in a 25 ml glass Erlenmeyer flask and stirred. Then, 1 ml of the silicic anhydride dispersion slurry was taken by an injector, and then injected into the flask for reaction. The amount of hydrogen (X' mol) generated by the reaction of the silanol groups on the surface of silicic anhydride with LiAlH$_4$ was quantitatively analyzed by gas chromatography.

The reaction is represented by the above-mentioned reaction formula (1). According to this reaction, one molecule of hydrogen is produced from one silanol group. If the specific surface area A (m$^2$/g) of silicic anhydride is separately obtained by BET method based on the N$_2$ absorption, the surfacial silanol group density is obtained in accordance with the following equation.

$$\text{Surfacial silanol group density (number of silanol groups/100 Å}^2\text{)} = \frac{30 \times X' \times N}{A \times 10^{20}} \times 100$$

where
N: Avogadro's constant $6.023 \times 10^{23}$

EXAMPLE 1

Dry method silicic anhydride (Aerosil #200, manufactured by Nippon Aerosil Co., average primary particle size: 16 m$\mu$m, specific surface area: 200 m$^2$/g, surfacial silanol group density: 4.0/100 Å$^2$, total organic carbon: 0.03 wt. %) was treated in a gas phase with methyl trimethoxysilane as a silane coupling agent, at 150° C. for 10 minutes, to obtain a powder having a total organic carbon content of 0.5% by weight and a surfacial silanol group density of 2.5/100 Å$^2$.

The treated silicic anhydride was dispersed in deionized water to obtain slurries having various concentrations, and the viscosities of the slurries are shown in Table 1. No precipitation of particles was observed in these slurries even upon expiration of one month.

EXAMPLE 2

The same dry method silicic anhydride (Aerosil #200) as used in Example 1 was treated in a gas phase with n-butyl alcohol at 230° C. under a nomal pressure for 10 minutes to obtain a powder having a total organic carbon content of 0.8% by weight and a surfacial silanol group density of $1.9/100$ Å$^2$.

The treated silicic anhydride was dispersed in deionized water to obtain slurries having various concentrations, and the viscosities of the slurries are shown in Table 1. No precipitation of particles was observed in these slurries even upon expiration of one month.

EXAMPLE 3

The same dry method silicic anhydride (Aerosil #200) as used in Example 1, was heat-treated at 700° C. for 2 hours, to obtain a powder having a total organic carbon content of 0.02% by weight and a surfacial silanol group density of $2.2/100$ Å$^2$.

The treated silicic anhydride was dispersed in deionized water and adjusted the pH to 10.5 with aqueous ammonia, to obtain slurries having various concentrations, and the viscosities of the slurries are shown in Table 1.

No precipitation of particles was observed in these slurries even upon expiration of one month.

EXAMPLE 4

The same dry method silicic anhydride (Aerosil #200) as used in Example 1, was treated in a gas phase with hexamethyldisilazane (CH$_3$)$_3$SiNHSi(CH$_3$)$_3$ at 200° C. for 60 minutes to obtain a powder having a total organic carbon content of 2.1% by weight and a surfacial silanol group density of $0.8/100$ Å$^2$.

The treated silicic anhydride was dispersed in aqueous solution containing 50% by volume of isopropanol to obtain slurries having various concentrations, and the viscosities of the slurries are shown in Table 1.

No precipitation of particles was observed in these slurries even upon expiration of one month.

COMPARATIVE EXAMPLE 1

The same dry method silicic anhydride (Aerosil #200) as used in Example 1 was dispersed in deionized water as it is, whereby the resulting slurry containing 10% by weight of silicic anhydride was highly viscous with a viscosity of 5100 cp (at 25° C.). Further, it was difficult to obtain a 20 wt. % slurry because gelation took place considerably.

A low concentration slurry containing 5% by weight of silicic anhydride had a viscosity as low as 13 cp (at 25° C.), but the majority of particles was found precipitated upon expiration of three days.

COMPARATIVE EXAMPLE 2

The same dry method silicic anhydride (Aerosil #200) as used in Example 1 was treated in a gas phase with the vapour of hexamethyldisilazane (CH$_3$)$_3$SiNHSi(CH$_3$)$_3$ at 350° C. for 30 minutes to obtain a powder having a total organic carbon content of 3.0% by weight and a surfacial silanol group density of $0.25/100$ Å$^2$.

The treated silicic anhydride was dispersed in an aqueous solution containing 50% by volume of isopropanol, whereby a slurry containing 10% by weight of silicic anhydride showed a viscosity of 65 cp, and a slurry containing 20% by weight of silicic anhydride showed a viscosity of 7000 cp.

The slurry containing 10% by weight of silicic anhydride had a relatively low viscosity, but a part of particles was found precipitated upon expiration of three days.

TABLE 1

| | Surfacial silanol group density (number of silanol groups/100 Å$^2$) | Total organic carbon content (wt. %) | Silicic anhydride concentration (wt. %) | Viscosity (25° C.) (c.p.) |
|---|---|---|---|---|
| Example 1 | 2.5 | 0.5 | 10 | 15 |
| | 2.5 | 0.5 | 20 | 175 |
| Example 2 | 1.9 | 0.8 | 10 | 22 |
| | 1.9 | 0.8 | 20 | 310 |
| Example 3 | 2.2 | 0.02 | 10 | 30 |
| | 2.2 | 0.02 | 20 | 340 |
| Example 4 | 0.6 | 2.1 | 10 | 8 |
| | 0.6 | 2.1 | 20 | 95 |
| Comparative Example 1 | 4.0 | | 5 | 13 (precipitated) |
| | 4.0 | | 10 | 5,100 |
| | 4.0 | | 20 | gelation |
| Comparative Example 2 | 0.25 | 3.0 | 10 | 65 (precipitated) |
| | 0.25 | 3.0 | 20 | 7,000 |

EXAMPLE 5

(Abrasion test)

To 1 liter of an aqueous dispersion (dispersing medium: water) containing 10% by weight of silicic anhydride obtained in Example 1 having a surfacial silanol group density of $2.5/100$ Å$^2$, 1 liter of alumina sol (AS-520, manufactured by Nissan Chemical Industries Ltd., Al$_2$O$_3$: 20 wt. %) and 2 liter of water were mixed to obtain an abrasive. Abrasion of a silicon wafer was conducted by means of this abrasive.

For the abrasion, a table made of a soft metal was used, and the silicon wafer was fixed to a wafer-holding block with wax. While the above abrasive was dropped at a constant rate of 100 ml/min, the abrasion was conducted for 10 minutes by rotating the table at a speed of 50 rpm and the wafer-holding block at a speed of 200 rpm under a pressure of 100 g/cm$^2$.

The polished wafer had a surface roughness of $R_{max}=0.1$ μm, thus indicating high degree of surface finish.

COMPARATIVE EXAMPLE 3

(Abrasion test)

To 1 liter of colloidal silica (Snowtex 40-LL, manufactured by Nissan Chemical Industries Ltd., SiO$_2$: 40-41 wt. %), 1 liter of alumina sol (AS-520, manufactured by Nissan Chemical Industries Ltd., Al$_2$O$_3$: 20 wt. %) and 2 liter of water were mixed to obtain an abrasive. By using this abrasive, the abrasion of a silicon wafer was conducted in the same manner as in Example 5.

The polished wafer had a surface roughness of 120 μm, and many scratch marks were observed.

We claim:

1. An abrasive composition comprising an aqueous dispersion of silicic anhydride, which comprises an aqueous solvent and silicic anhydride dispersed therein, wherein the silicic anhydride has a surfacial silanol group density of from 0.3 to 3 per 100 Å$^2$ and is obtained by the surface treatment of silicic anhydride produced by a dry method.

2. The abrasive composition according to claim 1, wherein the aqueous dispersion of silicic anhydride further contains alumina.

3. The abrasive composition according to claim 2, wherein the abrasive comprises a mixture of the aqueous dispersion of silicic anhydride and alumina sol.

4. The abrasive composition according to claim 2, wherein alumina is present in an amount of from 0.5 to 2 times by weight the amount of silicic anhydride.

5. The abrasive composition according to claim 2, wherein silicic anhydride and alumina are present in a total amount of from 5 to 50% by weight in the aqueous dispersion.

6. The abrasive composition according to claim 2, wherein alumina has an average particle size of from 0.01 to 0.3 μm.

7. The abrasive composition accoridng to claim 6, wherein alumina has an average particle size of 0.1±0.06 μm.

8. The abrasive composition according to claim 1, wherein the silicic anhydride has an average particle size of from 0.01 to 1 μm.

9. The abrasive composition according to claim 1, wherein the silicic anhydride has an average particle size of from 0.01 to 0.1 μm.

10. The abrasive composition according to claim 1, wherein the surfacial silanol group density of the silicic anhydride is from 0.5 to 2.5 per 100 $Å^2$.

11. The abrasive composition according to claim 1, wherein the surfacial silanol group density of the silicic anhydride is from 0.5 to under 2 per 100 $Å^2$.

12. The abrasive composition according to claim 1, wherein the aqueous solvent is water or an aqueous solution containing a water-soluble organic solvent.

13. The abrasive composition according to claim 12 wherein the aqueous solvent is water.

14. The abrasive composition according to claim 1, wherein the surface treatment of silicic anhydride is conducted by a coupling reaction with a coupling agent, an esterification reaction with an alcohol or a dehydration condensation reaction under heating.

15. The abrasive composition according to claim 14, wherein the coupling agent is methyltrimethoxysilane or hexamethyldisilazane.

16. The abrasive composition according to claim 14, wherein the alcohol is n-butyl alcohol.

17. The abrasive composition according to claim 14, wherein the dehydration condensation reaction under heating is conducted at a temperature of at least 300° C.

18. The abrasive composition according to claim 17, wherein the dehydration condensation reaction under heating is conducted at a temperature of at least 500° C.

* * * * *